(12) United States Patent
Kim

(10) Patent No.: US 9,190,176 B2
(45) Date of Patent: Nov. 17, 2015

(54) MEMORY DEVICE WITH REDUNDANCY PAGE BUFFER ARRAY

(75) Inventor: Bo-Kyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 580 days.

(21) Appl. No.: 13/609,499

(22) Filed: Sep. 11, 2012

(65) Prior Publication Data
US 2013/0315013 A1 Nov. 28, 2013

(30) Foreign Application Priority Data
May 22, 2012 (KR) ......................... 10-2012-0054373

(51) Int. Cl.
G11C 29/00 (2006.01)
G11C 7/10 (2006.01)
(52) U.S. Cl.
CPC ............ *G11C 29/808* (2013.01); *G11C 7/1039* (2013.01)
(58) Field of Classification Search
CPC .. G11C 29/846; G11C 29/808; G11C 29/781; G11C 29/785; G11C 7/10; G11C 7/1039
USPC ................................... 365/185.09
See application file for complete search history.

(56) References Cited

U.S. PATENT DOCUMENTS

| | | | |
|---|---|---|---|
| 4,660,179 A * | 4/1987 | Aoyama ....................... | 365/200 |
| 5,157,628 A * | 10/1992 | Tani .............................. | 365/200 |
| 6,122,194 A * | 9/2000 | Chung et al. ............. | 365/185.09 |
| 6,178,127 B1 * | 1/2001 | Haraguchi ..................... | 365/200 |
| 2002/0001896 A1 * | 1/2002 | Yoon ............................. | 438/200 |
| 2003/0106001 A1 * | 6/2003 | Kurumada et al. ........... | 714/718 |
| 2004/0240268 A1 * | 12/2004 | Kim et al. ................. | 365/185.09 |
| 2005/0232035 A1 * | 10/2005 | Miyakawa et al. ........... | 365/200 |
| 2006/0044918 A1 * | 3/2006 | Kang et al. ............... | 365/230.03 |

FOREIGN PATENT DOCUMENTS

| | | |
|---|---|---|
| KR | 1020040102599 | 12/2004 |
| KR | 1020050108142 | 11/2005 |
| KR | 1020110001060 | 1/2011 |
| KR | 1020110078732 | 7/2011 |

\* cited by examiner

*Primary Examiner* — Vanthu Nguyen
*Assistant Examiner* — Khamdan Alrobaie
(74) *Attorney, Agent, or Firm* — IP & T Group LLP

(57) ABSTRACT

A memory device includes a first main page buffer array configured to access data of a first main memory array; a second main page buffer array configured to access data of a second main memory array; a redundancy page buffer array configured to access data of a redundancy memory array replacing the first and second main memory array; a first redundancy transfer unit configured to transfer data between the redundancy page buffer array and the outside of the memory device through a first redundancy bus, when a first column address indicates one or more defective columns of the first main memory array; and a second redundancy transfer unit configured to transfer data between the redundancy page buffer array and the outside through a second redundancy bus, when a second column address indicates one or more defective columns of the second main memory array.

6 Claims, 4 Drawing Sheets

MEMORY DEVICE WITH REDUNDANCY PAGE BUFFER ARRAY

CROSS-REFERENCE TO RELATED APPLICATIONS

The present application claims priority of Korean Patent Application No. 10-2012-0054373, filed on May 22, 2012, which is incorporated herein by reference in its entirety.

BACKGROUND

1. Field

Exemplary embodiments of the present invention relate to a memory device and a data input/output method thereof, and more particularly, to technology for increasing the efficiency and stability of a repair operation of a memory device, which is performed during data input/output.

2. Description of the Related Art

During a fabrication process of a semiconductor memory device, any one of a great number of memory cells may become defective. If the semiconductor memory device is discarded as a defective product due to some defective cells, it is inefficient in terms of yield.

Therefore, a defective unit cell is replaced with a redundant unit cell which is additionally installed in a memory device. Accordingly, the entire memory device is recovered to thereby increase the yield.

FIG. 1 is a diagram illustrating a repair operation in a conventional memory device.

The memory device includes a first main memory array 10, a first main page buffer array 20, a first redundancy memory array 15, a first redundancy page buffer array 25, a second main memory array 30, a second main page buffer array 40, a second redundancy memory array 35, and a second redundancy page buffer array 45.

The first main page buffer array 20 is configured to access data of the first main memory array 10. The first main page buffer array 20 performs a program operation of storing data in the first main memory array 10 and a read operation of reading data from the first main memory array 10.

The first redundancy memory array 15 is configured to replace columns including defective memory cells, among a plurality of columns forming the first main memory array 10, by the column as the unit.

The first redundancy page buffer array 25 is configured to access data of the first redundancy memory array 15. The first redundancy page buffer array 25 performs a program operation of storing data in the first redundancy memory array 15 and a read operation of reading data from the first redundancy memory array 15.

The second main page buffer array 40 is configured to access data of the second main memory array 30. The second main page buffer array 40 performs a program operation of storing data in the second main memory array 30 and a read operation of reading data from the second main memory array 30.

The second redundancy memory array 35 is configured to replace columns including defective memory cells, among a plurality of columns forming the second main memory array 30, by the column as the unit.

The second redundancy page buffer array 45 is configured to access data of the second redundancy memory array 35. The second redundancy page buffer array 45 performs a program operation of storing data in the second redundancy memory array 35 and a read operation of reading data from the second redundancy memory array 35.

When an inputted column address corresponds to a defective column among the columns forming the first main memory array 10, the first redundancy page buffer array 25 performs a read/program operation on a column of the columns within the first redundancy memory array 15, instead of the defective column within the first main memory array 10. Similarly, when the inputted column address corresponds to a defective column among the columns forming the second main memory array 30, the second redundancy page buffer array 45 performs a read/program operation on a column of the columns within the second redundancy memory array 35, instead of the defective column within the second main memory array 30.

As illustrated in FIG. 1, the conventional memory device separately includes the first redundancy memory array 15 for replacing defective columns within the first main memory array 10 and the second redundancy memory array 35 for replacing defective columns within the second main memory array 30. Therefore, the defective column within the first main memory array 10 may not be replaced with a column of the second redundancy memory array 35, and the defective column within the second main memory array 30 may not be replaced with a column of the first redundancy memory array 15. Accordingly, when a large number of defective cells exist in any one of the first and second main memory arrays 10 and 30, for example, when such a large number of defective cells as not to be replaced with the first redundancy memory array 15 exist in the first main memory array 10, the entire memory device is to be discarded even though the second redundancy memory array 35 includes columns to replace defective columns.

SUMMARY

An exemplary embodiment of the present invention is directed to a memory device capable of performing a repair operation, even though a large number of defective cells exist in any one of first and second main memory arrays, and stably performing a repair operation without a data fail even though the repair operation is performed on the first and second main memory arrays at the same time.

In accordance with an exemplary embodiment of the present invention, a memory device includes a first main page buffer array configured to access data of a first main memory array; a second main page buffer array configured to access data of a second main memory array; a redundancy page buffer array configured to access data of a redundancy memory array replacing the first and second main memory array; a first redundancy transfer unit configured to transfer data between the redundancy page buffer array and the outside of the memory device through a first redundancy bus, when a first column address indicates one or more defective columns of the first main memory array; and a second redundancy transfer unit configured to transfer data between the redundancy page buffer array and the outside through a second redundancy bus, when a second column address indicates one or more defective columns of the second main memory array.

In accordance with another exemplary embodiment of the present invention, a data input method of a memory device includes transferring first data received from the outside of the memory device to a first redundancy bus, when a first column address indicates one or more defective columns within a first main memory array; transferring second data received from the outside to a second redundancy bus, when a second column address indicates one or more defective columns within a second main memory array; connecting the first redundancy bus to at least one or more redundancy page buffers, corresponding to the first column address indicating the defective columns within the first main memory array, in a redundancy page buffer array, and transferring the first data loaded in the first redundancy bus to the redundancy page buffers connected to the first redundancy bus; and connecting the second redundancy bus to at least one or more redundancy page buffers, corresponding to the second column address indicating the defective columns within the second main memory array, in the redundancy page buffer array, and transferring the second data loaded in the second redundancy bus to the redundancy page buffers connected to the second redundancy bus.

In accordance with still another exemplary embodiment of the present invention, a data output method of a memory device includes accessing data stored in one of a plurality of rows within a redundancy memory array, and latching the data in a redundancy page buffer array; connecting a first redundancy bus to at least one or more redundancy page buffers corresponding to a first column address in the redundancy page buffer array, when the first column address indicates one or more defective columns within a first main memory array, and outputting data latched in the redundancy page buffers connected to the first redundancy bus to the outside of the memory device; and connecting a second redundancy bus to at least one or more redundancy page buffers corresponding to a second column address in the redundancy page buffer array, when the second column address indicates one or more defective columns within a second main memory array, and outputting data latched in the redundancy page buffers connected to the second redundancy bus to the outside.

DETAILED DESCRIPTION

Figure 1:
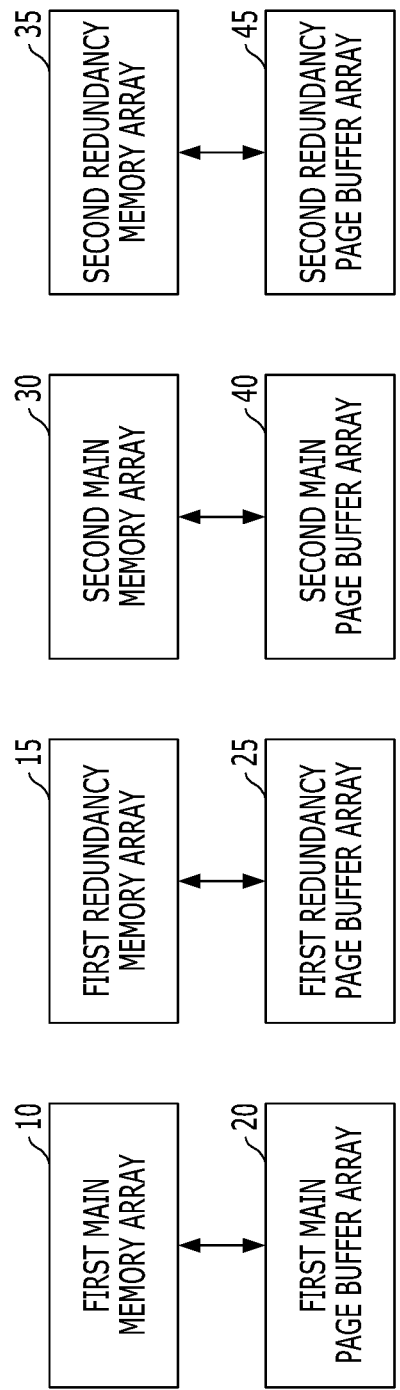
FIG. 1 is a diagram illustrating a repair operation in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
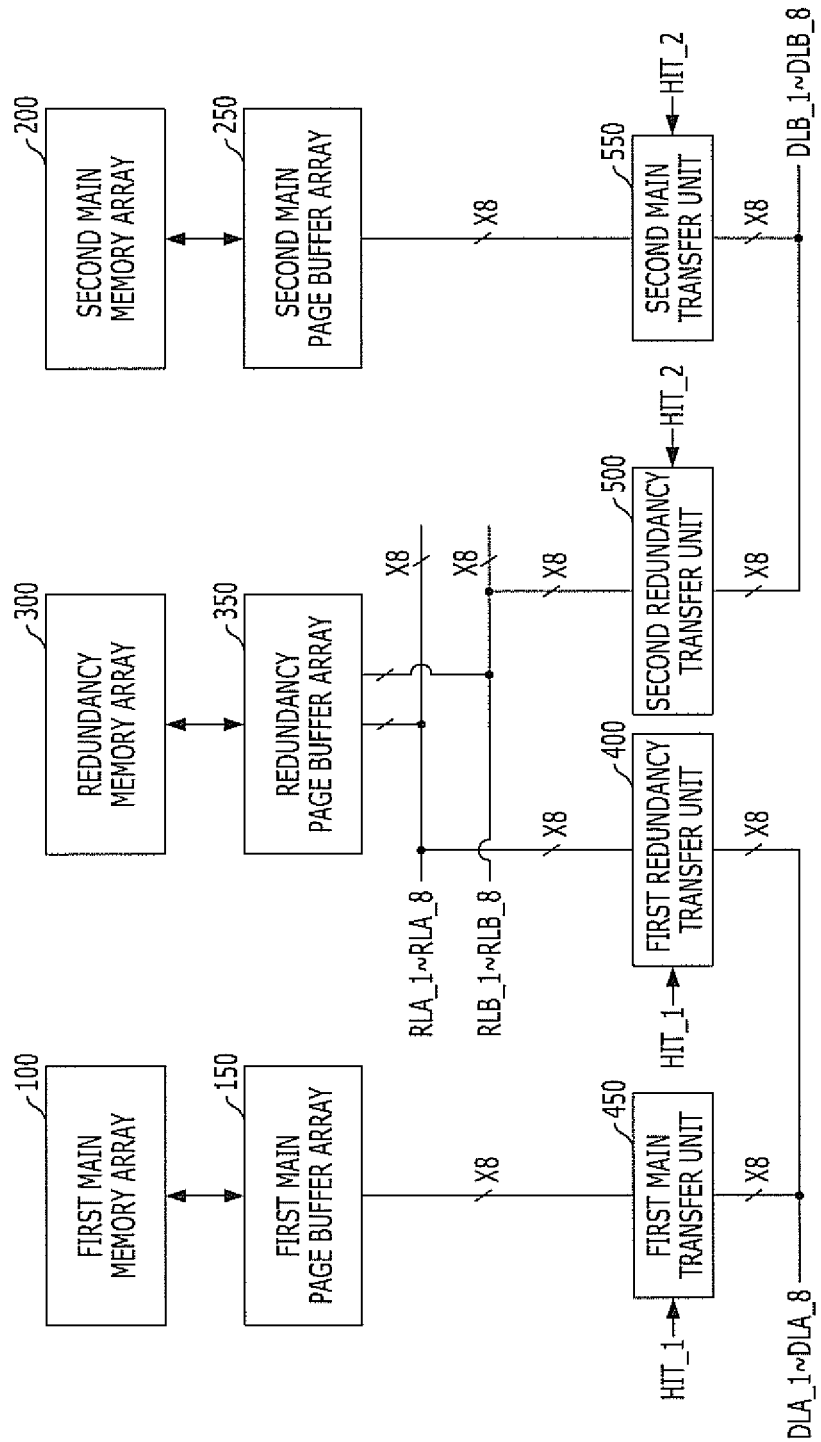
FIG. 2 illustrates a memory device in accordance with an exemplary embodiment of the present invention.

FIG. 2 illustrates a memory device in accordance with an exemplary embodiment of the present invention.

The memory device includes a first main memory array 100, a first main page buffer array 150, a second main memory array 200, a second main page buffer array 250, a redundancy memory array 300, a redundancy page buffer array 350, a first main transfer unit 450, a first redundancy transfer unit 400, a second redundancy transfer unit 500, and a second main transfer unit 550.

The first main memory array 100 includes a plurality of memory cells and is configured to store data. Specifically, the first main memory array 100 includes a plurality of memory cells arranged at P rows and M columns.

The first main page buffer array 150 includes a plurality of page buffers, and each of the page buffers is configured to access data of a corresponding memory cell of the first main memory array 100. The first main page buffer array 150 performs a program operation of storing data in the first main memory array 100 and a read operation of reading data from the first main memory array 100.

The second main memory array 200 includes a plurality of memory cells and is configured to store data. Specifically, the second main memory array 200 may be designed in the same size as or a different size from the first main memory array 100. Hereinafter, a case that the second main memory array 200 is designed in the same size as the first main memory array 100, that is, a case that each of the first and second main memory arrays 100 and 200 includes a plurality of memory cells arranged at P rows and M columns will be described as an example for description.

The second main page buffer array 250 includes a plurality of page buffers, and each of the page buffers is configured to access data of a corresponding memory cell of the second main memory array 200. The second main page buffer array 250 performs a program operation of storing data in the second main memory array 200 and a read operation of reading data from the second main memory array 200.

The redundancy memory array 300 is configured to replace a defective column within the first main memory array 100 and a defective column within the second main memory array 200. That is, the first main memory array 100 and the second main memory array 200 share one redundancy memory array 300. Here, the size of the redundancy memory array 300 may be designed to correspond to the sum of sizes of the first and second redundancy memory arrays 15 and 35 illustrated in FIG. 1.

The redundancy page buffer array 350 is configured to access data of the redundancy memory array 300. Specifically, the redundancy page buffer array 350 includes a plurality of redundancy page buffers, and each of the redundancy page buffers is configured to access data of a corresponding memory cell of the redundancy memory array 300. The redundancy page buffer array 350 performs a program operation of storing data in the redundancy memory array 300 and a read operation of reading data from the redundancy memory array 300.

The first redundancy transfer unit 400 is connected to the redundancy page buffer array 350 through a first redundancy bus RLA_1~RLA_8. The first redundancy transfer unit 400 is enabled when an inputted first column address indicates a defective column within the first main memory array 100. Here, the first column address includes information indicating which page buffer among the plurality of page buffers within the first main page buffer array 150 will latch data inputted from the outside during a program operation or information indicating which page buffer among the plurality of page buffers within the first main page buffer array 150 will output data latched therein during a read operation. Specifically, the first redundancy transfer unit 400 may be designed to be enabled in response to a first hit signal HIT_1. Here, the first hit signal HIT_1 is activated when the inputted first column address indicates a defective column within the first main memory array 100, and the first redundancy transfer unit 400 may be designed to be enabled when the first hit signal HIT_1 is activated to a high level and disabled when the first hit signal HIT_1 is deactivated to a low level. The enabled first redundancy transfer unit 400 is configured to transfer data inputted from the outside of the memory device, that is, data loaded in a first data bus DLA_1~DLA_8 to the first redundancy bus RLA_1~RLA_8 during a program operation, and it is configured to load data loaded in the first redundancy bus RLA_1~RLA_8 into the first data bus DLA_1~DLA_8 to be outputted to the outside during a read operation.

The first main transfer unit 450 is enabled when the inputted first column address indicates a normal column within the first main memory array 100. Specifically, the first main transfer unit 450 may be designed to be enabled in response to the first hit signal HIT_1. That is, the first main transfer unit 450 may be designed to be disabled when the first hit signal HIT_1 is activated to a high level and enabled when the first hit signal HIT_1 is deactivated to a low level. The enabled first main transfer unit 450 is configured to transfer data inputted from the outside, that is, data loaded in the first data bus DLA_1~DLA_8 to the first main page buffer array 150 during a program operation, and it is configured to load data outputted from the first main page buffer array 150 into the first data bus DLA_1~DLA_8 to be outputted to the outside during a read operation.

The second redundancy transfer unit 500 is connected to the redundancy page buffer array 350 through a second redundancy bus RLB_1~RLB_8. The second redundancy transfer unit 500 is enabled when an inputted second column address indicates a defective column of the second main memory array 200. Here, the second column address includes information indicating which page buffer among the plurality of page buffers within the second main page buffer array 250 will latch data inputted from the outside during a program operation or information indicating which page buffer among the plurality of page buffers within the second main page buffer array 250 will output data latched therein during a read operation. Specifically, the second redundancy transfer unit 500 may be designed to be enabled in response to a second hit signal HIT_2. Here, the second hit signal HIT_2 is activated when the inputted second column address indicates a defective column of the second main memory array 200, and the second redundancy transfer unit 500 may be designed to be enabled when the second hit signal HIT_2 is activated to a high level and disabled when the second hit signal HIT_2 is deactivated to a low level. The enabled second redundancy transfer unit 500 transfers data inputted from the outside, that is, data loaded in a second data bus DLB_1~DLB_8 to the second redundancy bus RLB_1~RLB_8 during a program operation, and it loads data loaded in the second redundancy bus RLB_1~RLB_8 into the second data bus DLB_1~DLB_8 to be outputted to the outside during a read operation. Meanwhile, since the first and second main page buffer arrays 150 and 250 may be used at the same time, the first and second column addresses may have the same value.

The second main transfer unit 550 is enabled when the inputted second column address indicates a normal column of the second main memory array 200. Specifically, the second main transfer unit 550 may be designed to be enabled in response to the second hit signal HIT_2. That is, the second main transfer unit 550 may be designed to be disabled when the second hit signal HIT_2 is activated to a high level and enabled when the second hit signal HIT_2 is deactivated to a low level. The enabled second main transfer unit 550 transfers data inputted from the outside, that is, data loaded in the second data bus DLB_1~DLB_8 to the second main page buffer array 250 during a program operation, and it loads the data outputted from the second main page buffer array 250 into the second data bus DLB_1~DLB_8 to be outputted to the outside during a read operation.

Figure 3A:
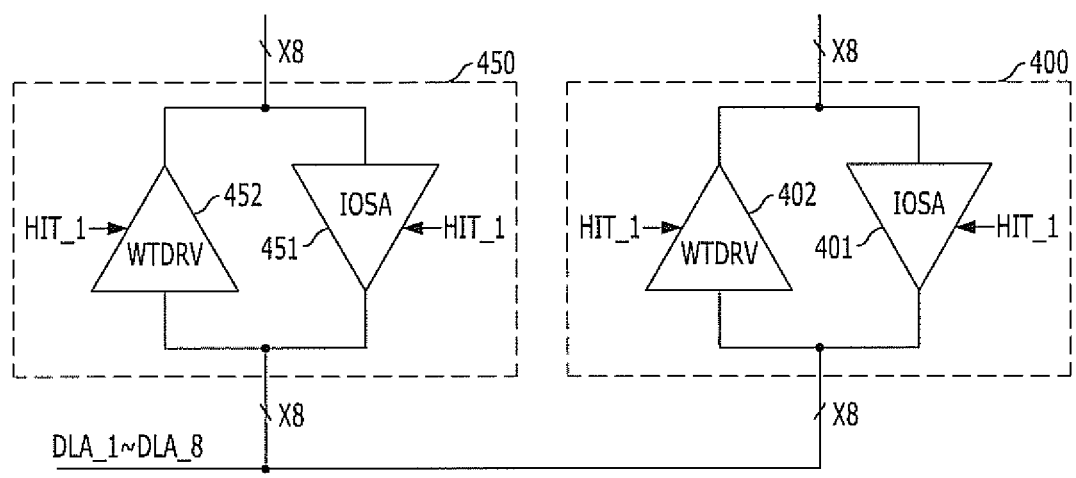
FIG. 3A is a schematic diagram illustrating an embodiment of a first redundancy transfer unit and an exemplary embodiment of a first main transfer unit shown in FIG. 2.

FIG. 3A illustrates an embodiment of the first redundancy transfer unit 400 and an embodiment of the first main transfer unit 450 of FIG. 2.

The first redundancy transfer unit 400 includes a first amplifier 401 and a first write driver 402. The first amplifier 401 is configured to be enabled when the first column address indicates a defective column within the first main memory array 100 during a read operation, that is, when the first hit signal HIT_1 is activated during the read operation, amplify data loaded in the first redundancy bus RLA_1~RLA_8, and load the amplified data into the first data bus DLA_1~DLA_8 to be outputted to the outside. The first write driver 402 is configured to be enabled when the first column address indicates a defective column within the first main memory array 100 during a program operation, that is, when the first hit signal HIT_1 is activated during the program operation, and transfer data inputted from the outside, that is, data loaded in the first data bus DLA_1~DLA_8 to the first redundancy bus RLA_1~RLA_8.

The first main transfer unit 450 may include a third amplifier 451 and a third write driver 452. The third amplifier 451 is configured to be enabled when the first column address indicates a normal column within the first main memory array 100 during a read operation, that is, when the first hit signal HIT_1 is deactivated during the read operation, amplify data outputted from the first main page buffer array 150, and load the amplified data into the first data bus DLA_1~DLA_8 to be outputted to the outside. The third write driver 452 is configured to be enabled when the first column address indicates a normal column within the first main memory array 100 during a program operation, that is, when the first hit signal HIT_1 is deactivated during the program operation, and transfer data inputted from the outside, that is, data loaded in the first data bus DLA_1~DLA_8 to the first main page buffer array 150.

Figure 3B:
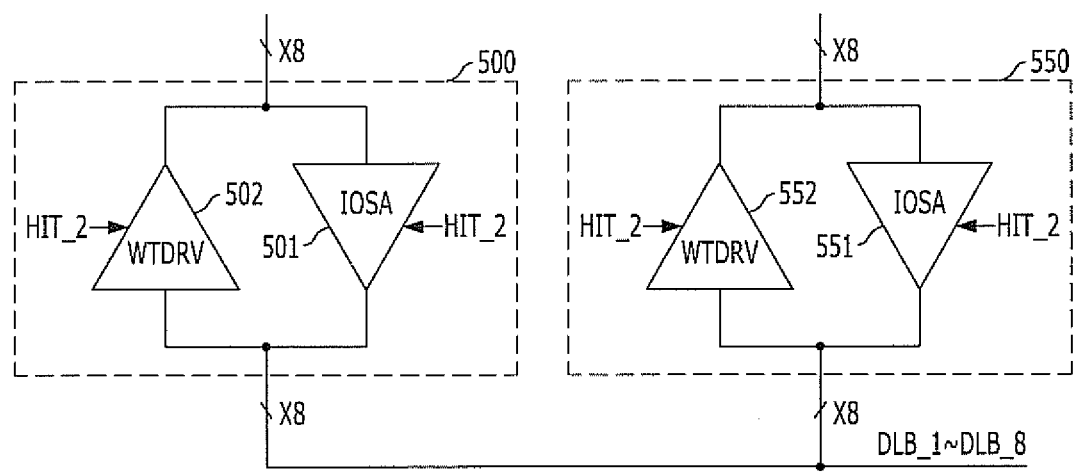
FIG. 3B is a schematic diagram illustrating an exemplary embodiment of a second redundancy transfer unit and an embodiment of a second main transfer unit shown in FIG. 2.

FIG. 3B illustrates an embodiment of the second redundancy transfer unit 500 and an embodiment of the second main transfer unit 550 of FIG. 2.

The second redundancy transfer unit 500 may include a second amplifier 501 and a second write driver 502. The second amplifier 501 is configured to be enabled when the second column address indicates a defective column within the second main memory array 200 during a read operation, that is, when the second hit signal HIT_2 is activated during the read operation, amplify data loaded in the second redundancy bus RLB_1~RLB_8, and load the amplified data into the second data bus DLB_1~DLB_8 to be outputted to the outside. The second write driver 502 is configured to be enabled when the second column address indicates a defective column within the second main memory array 200 during a program operation, that is, when the second hit signal HIT_2 is activated during the program operation, and transfer data inputted from the outside, that is, data loaded in the second data bus DLB_1~DLB_8 to the second redundancy bus RLB_1~RLB_8.

The second main transfer unit 550 may include a fourth amplifier 551 and a fourth write driver 552. The fourth amplifier 551 is configured to be enabled when the second column address indicates a normal column within the second main memory array 200 during a read operation, that is, when the second hit signal HIT_2 is deactivated during the read operation, amplify data outputted from the second main page buffer array 250, and load the amplified data into the second data bus DLB_1~DLB_8 to be outputted to the outside. The fourth write driver 552 is configured to be enabled when the second column address indicates a normal column within the second main memory array 200 during a program operation, that is, when the second hit signal HIT_2 is deactivated during the program operation, and transfer data inputted from the outside, that is, data loaded in the second data bus DLB_1~DLB_8 to the second main page buffer array 250.

Figure 4:
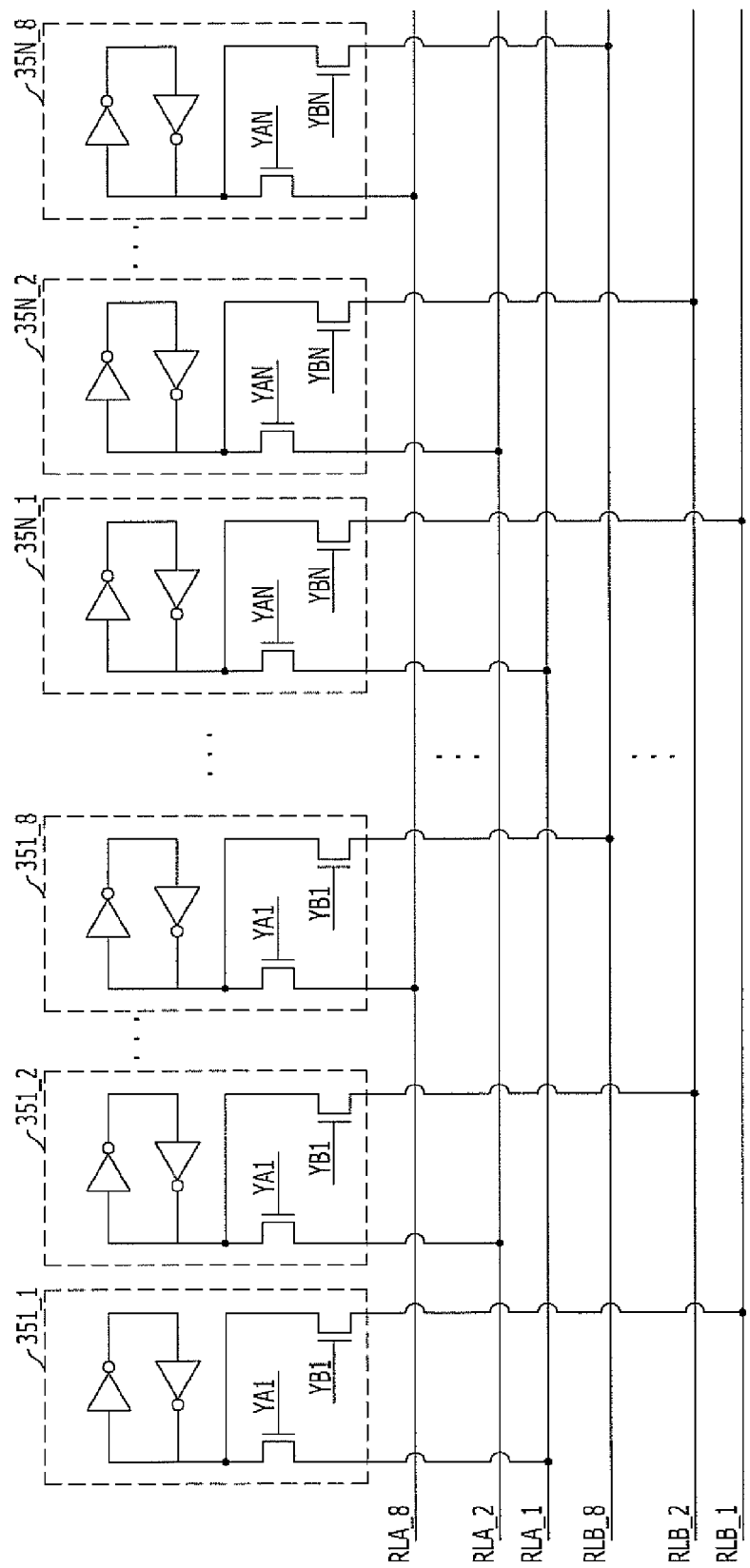
FIG. 4 is a circuit diagram illustrating an exemplary embodiment of a redundancy page buffer array shown in FIG. 2, which is connected to a first redundancy bus and a second redundancy bus.

FIG. 4 illustrates an embodiment of the redundancy page buffer array 350 of FIG. 2, which is connected to the first redundancy bus RLA_1~RLA_8 and the second redundancy bus RLB_1~RLB_8.

The redundancy page buffer array 350 includes a plurality of page buffers 351_1 to 35N_8. Here, each of the page buffers may be designed to correspond to one column or a pair of columns (even column and odd column) among a plurality of columns within the redundancy memory array 300. Hereinafter, for description purposes, a case that each of the page buffers is designed to correspond to one column among the plurality of columns within the redundancy memory array 300 will be shown as an example. That is, the page buffer 351_1 corresponds to a first column within the redundancy memory array 300, the page buffer 351_2 corresponds to a second column within the redundancy memory array 300, and the page buffer 351_8 corresponds to an eighth column within the redundancy memory array 300.

FIG. 4 illustrates a case that the redundancy page buffer array 350 includes 8×N page buffers and the same select signals YA1 to YAN and YB1 to YBN are shared by every eight page buffers. Specifically, the redundancy page buffer array 350 may be divided into N page buffer groups each consisting of eight page buffers. The first page buffer group 351_1~351_8 is connected to the first redundancy bus RLA_1~RLA_8 when a first-first select signal YA1 is activated. Specifically, when the first-first select signal YA1 is activated, the page buffer 351_1 is connected to the first redundancy bus RLA_1, the page buffer 351_2 is connected to the first redundancy bus RLA_2, and the page buffer 351_8 is connected to the first redundancy bus RLA_8. Furthermore, the first page buffer group 351_1~351_8 is connected to the second redundancy bus RLB_1~RLB_8 when a second-first select signal YB1 is activated. Specifically, when the second-first select signal YB1 is activated, the page buffer 351_1 is connected to the second redundancy bus RLB_1, the page buffer 351_2 is connected to the second redundancy bus RLB_2, and the page buffer 351_8 is connected to the second redundancy bus RLB_8. Similarly, the N-th page buffer group 35N_1~35N_8 is connected to the first redundancy bus RLA_1~RLA_8, when a first-N-th select signal YAN is activated, and connected to the second redundancy bus RLB1~RLB_B when the second-N-th select signal YBN is activated.

Meanwhile, among the first select signals YA1 to YAN, a select signal corresponding to the first column address is activated. Furthermore, among the second select signal YB1 to YBN, a select signal corresponding to the second column address is activated. For example, when ①the redundancy memory array 300 includes 32 columns, ② ninth to 16th columns among M columns within the first main memory array 100 include one or more defective columns and are replaced with first to eighth columns among the 32 columns within the redundancy memory array 300, ③ ninth to 16th columns among M columns within the second main memory array 200 include one or more defective columns and are replaced with ninth to 16th columns among the 32 columns within the redundancy memory array 300, the inputted first column address may indicate the ninth to 16th columns of the first main memory array 100 and the inputted second column address may indicate the ninth to 16th columns of the second main memory array 200. In this case, the first-first select signal YA1 corresponding to the inputted first column address, among the first select signals YA1 to YA4, is activated, and the second-second select signal YB2 corresponding to the inputted second column address, among the second select signals YB1 to YB4, is activated. As another example, when ① 513th to 520th columns among M columns within the first main memory array 100 include one or more defective columns and are replaced with 25th to 32nd columns among the 32 columns within the redundancy memory array 300, ② 257th to 264th columns among M columns within the second main memory array 200 include one or more defective columns and are replaced with 17th to 24th columns among the 32 columns within the redundancy memory array 300, the inputted first column address may indicate the 513th to 520th columns of the first main memory array 100 and the inputted second column address may indicate the 257th to 264th columns of the second main memory array 200. In this case, the first-fourth select signal YA4 corresponding to the inputted first column address, among the first select signals YA1 to YA4, is activated, and the second-third select signal YB3 corresponding to the inputted second column address, among the second select signals YB1 to YB4, is activated.

The redundancy page buffer array 350 illustrated FIG. 4 shares the same select signals YA1 to YAN and YB1 to YBN in every eight page buffers. Therefore, when a column address indicating defective columns within the first or second main memory array 100 or 200 is inputted, eight page buffers within the redundancy page buffer array 350 are enabled, and eight columns including the defective columns within the main memory array are replaced with the redundancy memory array 300.

The configuration of FIG. 4 is only an example, and the memory device in accordance with the embodiment of the present invention may be designed in such a manner that the respective page buffers forming the redundancy page buffer array 350 are connected to the redundancy buses RLA_1~RLA_8 and RLB_1~RLB_8 in response to different select signals, without sharing the select signals YA1 to YAN and Y81 to YBN. In this case, when a column address indicating a defective column within the first or second main memory array 100 or 200 is inputted, one page buffer corresponding to the column address in the redundancy page buffer array 250 is enabled, and the defective column within the main memory array is replaced with the redundancy memory array 300 one by one.

Now, a repair operation in the memory device illustrated in FIG. 2 will be described. Hereinafter, for description purposes, it is exemplary described that ① the first main memory array 100 includes 2048 columns, the second main memory array 200 includes 2048 columns, and the redundancy memory array 300 includes 32 columns, ② the 25th to 32nd columns of the first main memory array 100 include one or more defective columns and are replaced with the ninth to 16th columns of the redundancy memory array 300, ③ the ninth to 16th columns of the second main memory array 200 include one or more defective columns and are replaced with the first to eighth columns of the redundancy memory array 300, and ④ the first and second main memory arrays 100 and 200 are accessed at the same time.

1. During Program Operation

1-1. Operation of Repairing the First Main Memory Array 100

When the inputted first column address corresponds to the first to eighth columns within the first main memory array 100, the first column address indicates normal columns within the first main memory array 100. Therefore, the first hit signal HIT_1 is deactivated to a low level.

The first main transfer unit 450 is enabled in response to the deactivated first hit signal HIT_1 and transfers data inputted from the outside, that is, data loaded in the first data bus DLA_1~DLA_8 to the first main page buffer array 150. Meanwhile, the first redundancy transfer unit 400 is disabled in response to the deactivated first hit signal HIT_1 and does not transfer the data loaded in the first data bus DLA_1~DLA_8 to the first redundancy bus RLA_1~RLA_8.

The first main page buffer array 150 latches the data transferred from the first main transfer unit 450.

Similarly, when the inputted first column address corresponds to the ninth to 16th columns within the first main memory array 100 and when the inputted first column address corresponds to the 17th to 24th columns within the first main memory array 100, the first column address indicates normal columns within the first main memory array 100. Therefore, the first hit signal HIT_1 is deactivated to a logic low level, and the above-described process is repeated.

Furthermore, when the inputted first column address corresponds to the 25th to 32nd columns within the first main memory array 100, the first column address indicates defective columns within the first main memory array 100. Therefore, the first hit signal HIT_1 is activated to a high level.

The first redundancy transfer unit 400 is activated in response to the activated first hit signal HIT_1 and transfers the data loaded in the first data bus DLA_1~DLA_8 to the first redundancy bus RLA_1~RLA_8. Meanwhile, the first main transfer unit 450 is disabled in response to the activated first hit signal HIT_1 and does not transfer the data loaded in the first data bus DLA_1~DLA_8 to the first main page buffer array 150.

Since the 25th to 32nd columns within the first main memory array 100, indicated by the inputted first column address, were replaced with the ninth to 16th columns within the redundancy memory array 300, the first-second select signal YA2 is activated among the first select signals YA1 to YA4.

The second page buffer group 352_1~352_8 within the redundancy page buffer array 350 is connected to the first redundancy bus RLA_1~RLA_8 in response to the activated first-second select signal YA2. Then, the second page buffer group 352_1~352_8 within the redundancy page buffer array 350 latches the data loaded in the first redundancy bus RLA_1~RLA_8.

Furthermore, when the inputted first column address indicates the other columns within the first main memory array 100, that is, the 33rd to 2048th columns, the first column address indicates normal columns within the first main memory array 100. The first hit signal HIT_1 is deactivated to a low level.

The first main transfer unit 450 is enabled in response to the deactivated first hit signal HIT_1 and transfers data inputted from the outside, that is, data loaded in the first data bus DLA_1~DLA_8 to the first main page buffer array 150.

The first main page buffer array 150 latches the data transferred from the first main transfer unit 450.

1-2. Operation of Repairing the Second Main Memory 200

When the inputted second column address corresponds to the first to eighth columns within the second main memory array 200, the second column address indicates normal columns within the second main memory array 200. Therefore, the second hit signal HIT_2 is deactivated to a low level.

The second main transfer unit 550 is enabled in response to the deactivated second hit signal HIT_2 and transfers data inputted from the outside, that is, data loaded in the second data bus DLB_1~DLB_8 to the second main page buffer array 250. Meanwhile, the second redundancy transfer unit 500 is disabled in response to the deactivated second hit signal HIT_2 and does not transfer the data loaded in the second data bus DLB_1~DLB_8 to the second redundancy bus RLB_1~RLB_8.

The second main page buffer array 250 latches the data transferred from the second main transfer unit 550.

Furthermore, when the inputted second column address corresponds to the ninth to 16th columns within the second main memory array 200, the second column address indicates defective columns within the second main memory array 200. Therefore, the second hit signal HIT_2 is activated to a high level.

The second redundancy transfer unit 500 is enabled in response to the activated second hit signal HIT_2 and transfers the data loaded in the second data bus DLB_1~DLB_8 to the second redundancy bus RLB1~RLB8. Meanwhile, the second main transfer unit 550 is disabled in response to the activated second hit signal HIT_2 and does not transfer the data loaded in the second data bus DLB_1~DLB_8 to the second main page buffer array 250.

Since the ninth to 16th columns within the second main memory array 200, indicated by the inputted second column address, were replaced with the first to eighth columns within the redundancy memory array 300, the second-first select signal YB1 is activated among the second select signals YB1 to YB4.

The first page buffer group 351_1~351_8 within the redundancy page buffer array 350 is connected to the second redundancy bus RLB_1~RLB_8 in response to the activated second-first select signal YB1. Then, the first page buffer group 351_1~351_8 within the redundancy page buffer array 350 latches the data loaded in the second redundancy bus RLB_1~RBL_8.

Furthermore, when the inputted second column address indicates the other columns within the second main memory array 200, that is, the 17th to 2048th columns, the second column address indicates normal columns within the second main memory array 200. Therefore, the second hit signal HIT_2 is deactivated to a low level.

The second main transfer unit 550 is enabled in response to the deactivated second high signal HIT_2 and transfers data inputted from the outside, that is, data loaded in the second data bus DLB_1~DLB_8 to the second main page buffer array 250.

The second main page buffer array 250 latches the data transferred from the second main transfer unit 550.

1-3. When First or Second Main Page Buffer Array 150 or 250 Latches Such an Amount of Data as to be Programmed at Once When the first or second main page buffer array 150 or 250 latches such an amount of data as to be programmed at once, the first main page buffer array 150 programs the data latched therein into the first main memory array 100, the second main page buffer array 250 programs the data latched therein into the second main memory array 200, and the redundancy page buffer array 350 programs data latched therein into the redundancy memory array 300.

2. During Read Operation

The first main page buffer array 150 accesses and latches data stored in one row among a plurality of rows forming the first main memory array 100.

The second main page buffer array 250 accesses and latches data stored in one row among a plurality of rows forming the second main memory array 200.

The redundancy page buffer array 350 accesses and latches data stored in one row among a plurality of rows forming the redundancy memory array 300.

2-1. Operation of Repairing the First Main Memory Array 100

Among the plurality of page buffers within the first main page buffer arrays 150, page buffers corresponding to the inputted first column address output the data latched therein to the first main transfer unit 450.

When the inputted first column address indicates the first to eighth columns, the first column address indicates normal columns within the first main memory array 100. Therefore, the first hit signal HIT_1 is deactivated to a low level.

The first main transfer unit 450 is enabled in response to the deactivated first hit signal HIT_1 and loads the data outputted from the first main page buffer array 150 into the first data bus DLA_1~DLA8 to be outputted to the outside. Meanwhile, the first redundancy transfer unit 400 is disabled in response to the deactivated first hit signal HIT_1 and does not transfer data.

Similarly, when the inputted first column address corresponds to the ninth to 16th columns within the first main memory array 100 and when the inputted first column address corresponds to the 17th to 24th columns within the first main memory array 100, the first column address indicates normal columns within the first main memory array 100. Therefore, the first hit signal HIT_1 is deactivated to a low level, and the above-described process is repeated.

Furthermore, when the inputted first column address corresponds to the 25th to 32nd columns within the first main memory array 100, the first column address indicates defective columns within the first main memory array 100. Therefore, the first hit signal HIT_1 is activated to a high level.

The first main transfer unit 450 disabled in response to the activated first hit signal HIT_1 does not output the data outputted from the first main page buffer array 150 to the outside. That is, although the first main page buffer array 150 outputs data corresponding to the inputted first column address, among the data latched therein, to the first main transfer unit 450, the first main transfer unit 450 does not output the data outputted from the first main page buffer array 150 to the outside because it is disabled.

Meanwhile, since the 25th to 32nd columns within the first main memory array 100, indicated by the inputted first column address, were replaced with the ninth to 16th columns within the redundancy memory array 300, the first-second select signal YA2 is activated among the first select signals YA1 to YA4.

The second page buffer group 352_1~352_8 within the redundancy page buffer array 350 is connected to the first redundancy bus RLA_1~RLA_8 in response to the activated first-second select signal YA2. Furthermore, the second page buffer group 352_1~352_8 within the redundancy page buffer array 350 outputs data latched therein to the first redundancy transfer unit 400 through the first redundancy bus RLA_1~RLA_8.

The first redundancy transfer unit 400 is enabled in response to the activated first hit signal HIT_1 and loads the data loaded in the first redundancy bus RLA_1~RLA_8 into the first data bus DLA_1~DLA_8 to be outputted to the outside.

Furthermore, when the inputted first column address indicates the other columns within the first main memory array 100, that is, the 33rd to 2048th columns, the first main page buffer array 150 outputs data corresponding to the inputted first column address, among the data latched therein, to the first main transfer unit 450.

Since the inputted first column address indicates normal columns within the first main memory array 100, the first hit signal HIT_1 is deactivated to a low level.

The first main transfer unit 450 is enabled in response to the deactivated first hit signal HIT_1 and loads the data outputted from the first main page buffer array 150 into the first data bus DLA_1~DLA_8 to be outputted to the outside.

2-2. Operation of Repairing Second Main Memory Array 200

Among the plurality of page buffers within the second main page buffer array 250, page buffers corresponding to the inputted second column address output data latched therein to the second main transfer unit 550.

When the inputted second column address indicates the first to eighth columns, the second column address indicates normal columns within the second main memory array 200. Therefore, the second hit signal HIT_2 is deactivated to a low level.

The second main transfer unit 550 is enabled in response to the deactivated second hit signal HIT_2 and loads the data outputted from the second main page buffer array 250 into the second data bus DLB_1~DLB_8 to be outputted to the outside. Meanwhile, the second redundancy transfer unit 500 is disabled in response to the deactivated second hit signal HIT_2 and does not transfer data.

Furthermore, when the inputted second column address corresponds to the ninth to 16th columns within the second main memory array 200, the second column address indicates defective columns within the second main memory array 200. Therefore, the second hit signal HIT_2 is activated to a high level.

The second main transfer unit 550 disabled in response to the activated second hit signal HIT_2 does not output the data outputted from the second main page buffer array 250 to the outside. That is, although the second main page buffer array 250 outputs data corresponding to the inputted second column address, among the data latched therein, to the second main transfer unit 550, the second main transfer unit 550 does not output the data outputted from the second main page buffer array 250 to the outside because it is disabled.

Meanwhile, since the ninth to 16th columns within the second main memory array 200, indicated by the inputted second column address, were replaced with the first to eighth columns within the redundancy memory array 300, the second-first select signal YB1 is activated among the second select signals YB1 to YB4.

The first page buffer group 351_1~351_8 within the redundancy page buffer array 350 is connected to the second redundancy bus RLB_1 to RLB_8 in response to the activated second-first select signal YB1. Then, the first page buffer group 351_1~351_8 within the redundancy page buffer array 350 outputs data latched therein to the second redundancy transfer unit 500 through the second redundancy bus RLB_1 to RLB_8.

The second redundancy transfer unit 500 is enabled in response to the activated second hit signal HIT_2 and loads the data loaded in the second redundancy bus RLB_1~RLB_8 into the second data bus DLB_1~DLB_8 to be outputted to the outside.

Furthermore, when the inputted second column address indicates the other columns within the second main memory array 200, that is, the 17th to 2048th columns, the second main page buffer array 250 outputs data corresponding to the inputted second column address, among the data latched therein, to the second main transfer unit 550.

Since the inputted second column address indicates normal columns within the second main memory array 200, the second hit signal HIT_2 is deactivated to a low level.

The second main transfer unit 550 is enabled in response to the deactivated second hit signal HIT_2 and loads the data outputted from the second main page buffer array 250 into the second data bus DLB_1~DLB_8 to be outputted to the outside.

In accordance with the embodiment of the present invention, the first and second main memory arrays 100 and 200 share the redundancy memory array 300 having a size corresponding to the sum of sizes of the first and second redundancy memory arrays 15 and 35 in FIG. 1. Accordingly, although a large number of defective cells exist in any one of the first and second main memory arrays 100 and 200, the main memory array may be repaired. Therefore, the efficiency of the repair operation may be increased, thereby increasing the productivity of the memory device.

Meanwhile, as described above, when different page buffer groups within the redundancy page buffer array 350 are enabled at the same time, the page buffer groups may be connected to different redundancy buses. In the above-described embodiment, the first page buffer group 351_1~351_8 is connected to the second redundancy bus RLB_1~RLB_8, and the second page buffer group 352_1~352_8 is connected to the first redundancy bus RLA_1~RLA_8. Therefore, the redundancy page buffer array 350 may stably latch data inputted from the outside without a data fail during a program operation and may stably output data latched therein to the outside without a data fail during a read operation. Therefore, since the repair operation may be performed without a data fail, the reliability of the repair operation may be increased.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
a first main page buffer array configured to access data of a first main memory array;
a second main page buffer array configured to access data of a second main memory array;
a redundancy page buffer array configured to access data of a redundancy memory array replacing the first and second main memory array;
a first redundancy transfer unit configured to transfer data between the redundancy page buffer array and the outside of the memory device through a first redundancy bus, when a first column address indicates one or more defective columns of the first main memory array;
a second redundancy transfer unit configured to transfer data between the redundancy page buffer array and the outside through a second redundancy bus, when a second column address indicates one or more defective columns of the second main memory array;
a first main transfer unit configured to be enabled when the first column address indicates only one or more normal columns of the first main memory array and transfer data between the outside and the first main page buffer array; and
a second main transfer unit configured to be enabled when the second column address indicates only one or more normal columns of the second main memory array and transfer data between the outside and the second main page buffer array,
wherein the redundancy page buffer array comprises a plurality of page buffers, wherein each of the page buffers is connected to the first redundancy bus when the first column address corresponds to itself, and connected to the second redundancy bus when the second column address corresponds to itself.

2. The memory device of claim 1, wherein the first redundancy transfer unit is connected to the redundancy page buffer array through the first redundancy bus and configured to transfer the data from the outside of the memory device to the first redundancy bus or from the first redundancy bus to the outside when the first column address indicates one or more defective columns of the first main memory array.

3. The memory device of claim 1, wherein the second redundancy transfer unit is connected to the redundancy page buffer array through the second redundancy bus and configured to transfer the data from the outside of the memory device to the second redundancy bus or from the second redundancy bus to the outside when the second column address indicates one or more defective columns of the second main memory array.

4. The memory device of claim 1, wherein the first redundancy transfer unit comprises:
a first amplifier configured to be enabled when the first column address indicates one or more defective columns of the first main memory array during a read operation and amplify data loaded in the first redundancy bus to output an amplified data to the outside; and
a first write driver configured to be enabled when the first column address indicates one or more defective columns of the first main memory array during a program operation and transfer data inputted from the outside to the first redundancy bus, and
wherein the second redundancy transfer unit comprises:
a second amplifier configured to be enabled when the second column address indicates one or more defective columns of the second main memory array during a read operation and amplify data loaded in the second redundancy bus to output an amplified data to the outside; and
a second write driver configured to be enabled when the second column address indicates one or more defective columns of the second main memory array during a program operation, and transfer data inputted from the outside to the second redundancy bus.

5. The memory device of claim 4, wherein the first main transfer unit comprises:
a third amplifier configured to be enabled when the first column address indicates only one or more normal columns of the first main memory array during a read operation and amplify data transferred from the first main page buffer array to output an amplified data to the outside; and
a third write driver configured to be enabled when the first column address indicates only one or more normal columns of the first main memory array during a program operation and transfer data inputted from the outside to the first main page buffer array, and wherein the second main transfer unit comprises:
a fourth amplifier configured to be enabled when the second column address indicates only one or more normal columns of the second main memory array during a read operation and amplify data transferred from the second main page buffer array to output an amplified data to the outside; and
a fourth write driver configured to be enabled when the second column address indicates only one or more normal columns of the second main memory array during a program operation and transfer data inputted from the outside to the second main page buffer array.

6. The memory device of claim 1, wherein the first and second column addresses have the same value.

* * * * *